US012757359B2

(12) United States Patent
Giorgi et al.

(10) Patent No.: US 12,757,359 B2
(45) Date of Patent: Oct. 6, 2026

(54) ELECTRONIC POWER CONVERTER APPARATUS COMPRISING MUTUALLY SUPERIMPOSED CONVERTER MODULES AND A FORCED-VENTILATION COOLING UNIT

(71) Applicant: FRIEM S.P.A., Milan (IT)

(72) Inventors: Marco Giorgi, Milan (IT); Marcello Barberini, Milan (IT)

(73) Assignee: FRIEM S.P.A., Milan (IT)

( * ) Notice: Subject to any disclaimer, the term of this patent is extended or adjusted under 35 U.S.C. 154(b) by 48 days.

(21) Appl. No.: 18/534,115

(22) Filed: Dec. 8, 2023

(65) Prior Publication Data

US 2024/0215209 A1 Jun. 27, 2024

(30) Foreign Application Priority Data

Dec. 23, 2022 (IT) ........................ 102022000026742

(51) Int. Cl.

| | |
|---|---|
| ***H05K 7/20*** | (2006.01) |
| ***B60L 53/302*** | (2019.01) |
| ***H02M 3/00*** | (2006.01) |
| ***H02M 7/00*** | (2006.01) |

(52) U.S. Cl.

CPC ........ *H05K 7/20909* (2013.01); *B60L 53/302* (2019.02); *H02M 3/003* (2021.05); *H02M 7/003* (2013.01); *H05K 7/20145* (2013.01)

(58) Field of Classification Search

None

See application file for complete search history.

(56) References Cited

U.S. PATENT DOCUMENTS 6,504,714 B1 * 1/2003 Richter .............. H05K 7/20572 361/695
7,573,713 B2 * 8/2009 Hoffman ............ H05K 7/20136 361/679.48

(Continued)

FOREIGN PATENT DOCUMENTS

DE 20 2004 015168 U1 12/2004

OTHER PUBLICATIONS

Italian Search Report Received for IT Serial No. 202200026742 on Aug. 18, 2023, 6 pgs.

*Primary Examiner* — Courtney L Smith
(74) *Attorney, Agent, or Firm* — Merchant & Gould P.C.

(57) ABSTRACT

An electronic power converter apparatus has a box-like body including first and second base walls joined by side walls and a bottom wall orthogonal to the base walls, and extending along a longitudinal direction to delimit a housing compartment accessible through an opening. A first converter module is proximal a first base wall and a second converter module is superimposed on the first converter module along the longitudinal direction. The converter modules have circuitry generating heat to dissipate electrical energy. A forced-ventilation cooling unit includes heat dissipation devices conveying cooling air entering into the box-like body and corresponding heated air exiting from the box-like body. A first heat dissipation device is in the first converter between the first side wall and a median plane of the box-like body. A second heat dissipation device is in the second converter module between the second side wall and the median plane.

20 Claims, 8 Drawing Sheets

(56) References Cited

U.S. PATENT DOCUMENTS

| | | | | |
|---|---|---|---|---|
| 7,817,419 | B2 * | 10/2010 | Illerhaus | H02J 7/35 165/104.33 |
| 8,154,869 | B2 * | 4/2012 | Riebel | G06F 1/20 165/185 |
| 8,379,384 | B2 * | 2/2013 | Smalen | H05K 7/20909 312/236 |
| 8,472,181 | B2 * | 6/2013 | Doll | H05K 7/20736 361/752 |
| 8,472,194 | B2 * | 6/2013 | Rivera Hernandez | H05K 7/209 361/710 |
| 9,084,376 | B2 * | 7/2015 | Weiss | H05K 7/20163 |
| 9,706,690 | B2 * | 7/2017 | Liu | H05K 7/20909 |
| 9,943,007 | B2 * | 4/2018 | Enami | B61C 17/00 |
| 10,182,512 | B2 * | 1/2019 | Claeys | H05K 5/03 |
| 11,071,233 | B1 * | 7/2021 | Robert | H05K 9/0049 |
| 11,116,115 | B1 | 9/2021 | Lin | |
| 11,444,543 | B2 * | 9/2022 | Riou | H02P 27/06 |
| 2016/0366794 | A1 | 12/2016 | Dong | |
| 2022/0149743 | A1 | 5/2022 | Lan | |
| 2022/0183193 | A1 | 6/2022 | Hwang | |

* cited by examiner

ELECTRONIC POWER CONVERTER APPARATUS COMPRISING MUTUALLY SUPERIMPOSED CONVERTER MODULES AND A FORCED-VENTILATION COOLING UNIT

CROSS-REFERENCE TO RELATED APPLICATION

This application claims the benefit of priority to Application No. 102022000026742, filed Dec. 23, 2022 in Italy, and which application is incorporated herein by reference. To the extent appropriate, a claim of priority is made to the above-disclosed application.

FIELD OF APPLICATION

The present invention generally relates to the field of cooling systems for electrical or electronic equipment, e.g., housed in switchgear panels or electric cabinets. In particular, the invention relates to an electronic power converter apparatus housable in a switchgear panel or electric cabinet comprising two or more mutually superimposed converter modules and a forced-ventilation cooling unit to dissipate the heat generated by the modules.

PRIOR ART

As known, electrical and electronic equipment contained in a switchgear panel or electric cabinet for industrial use produces heat by the Joule effect. Such a heat needs to be dissipated to avoid reaching harmful overtemperatures for the equipment housed in the switchgear panel itself.

In order to dissipate the heat generated inside the switchgear panel, it is known to employ forced-ventilation cooling units associated with the electrical and electronic equipment in the switchgear panel. Such known forced-ventilation units generally comprise heat sinks connected to ventilation units, e.g., consisting of one or more fans, configured to forcedly convey air from the outside environment to the inside of the switchgear panel. In particular, the forced ventilation units operate to force an incoming air flow into the switchgear panel, which heats up by mixing with the air inside the panel itself. A corresponding flow of heated air is conveyed out of the switchgear panel. Such an exiting air flow is adapted to remove, at least partially, the heat generated by the Joule effect inside the switchgear panel to cool it.

For some industrial applications, it is known to manufacture power converter apparatuses comprising two converter modules, a first and a second module, connected to each other. In particular, such a power converter apparatus is obtained by superimposing the second converter module on the first converter module and can be housed inside an electric cabinet to be connected in parallel to similar converters to form modular structures.

Each of the aforesaid first and second converter modules produces heat by the Joule effect due to the dissipation of electrical energy. Moreover, the structure of the overall converter, in which the second converter module is placed above the first converter module, has the drawback that the first converter module placed at the bottom heats, by the Joule effect, the second converter module placed higher up.

Therefore, in the case of electronic power converter apparatuses including mutually superimposed converter modules, the need arises to find suitable contrivances which, by cooperating with the forced-ventilation cooling means, allow the heat generated by the Joule effect to be removed effectively from inside the converter.

Indeed, such a need is not fully met by the solutions currently available from the prior art.

SUMMARY OF THE INVENTION

It is the object of the present invention to devise and provide an electronic power converter apparatus, housable in a switchgear panel or electric cabinet, which includes two or more mutually superimposed converter modules and a forced-ventilation cooling unit, which allows at least partially overcoming the limitations of known solutions by ensuring effective removal of the heat generated by the Joule effect inside the converter.

BRIEF DESCRIPTION OF THE DRAWINGS

Further features and advantages of the electronic power converter apparatus, for example housable in a switchgear panel or electric cabinet according to the invention, will become apparent from the following description of preferred embodiments thereof, given by way of non-limiting indication, with reference to the accompanying drawings, in which.

Similar or equivalent elements in the aforesaid figures are indicated by the same reference numerals.

DETAILED DESCRIPTION OF PREFERRED EMBODIMENTS

Figure 2:
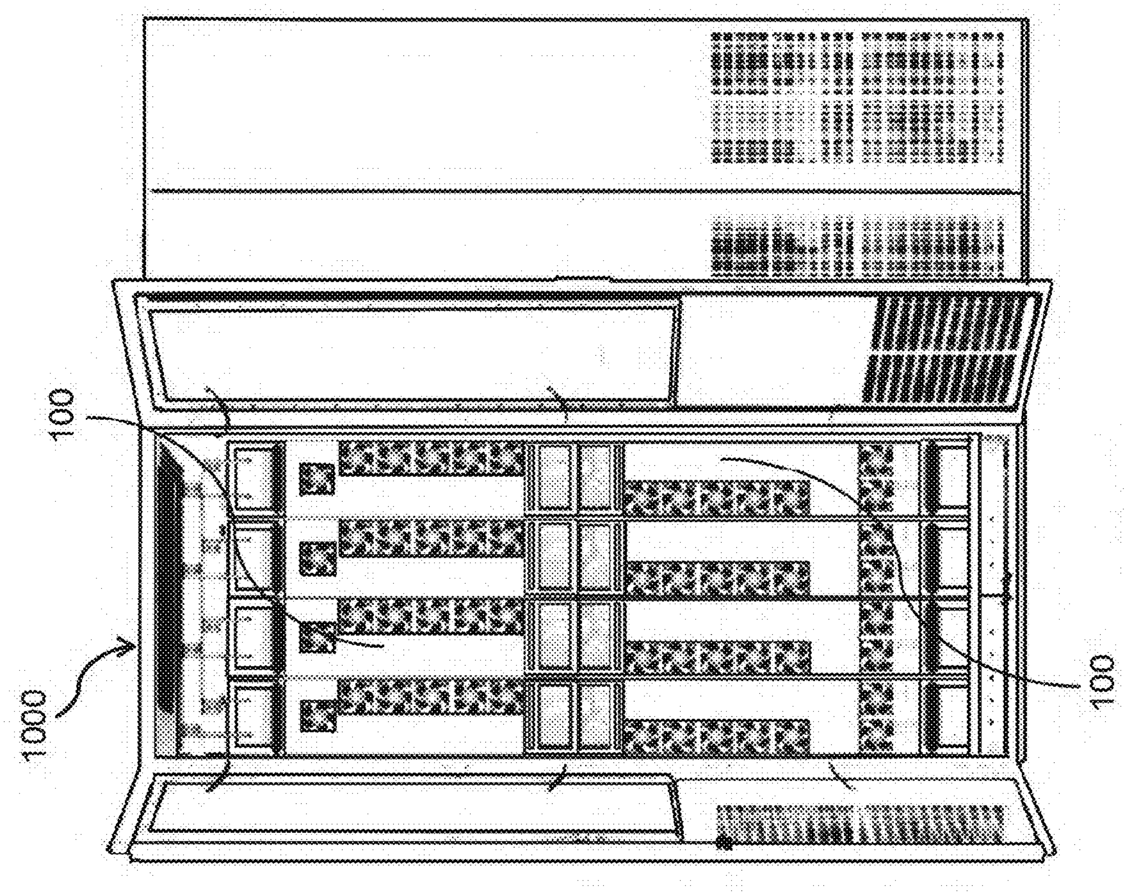
FIG. 2 shows a front view of an electric cabinet comprising four electronic power converter apparatuses similar to the converter in FIG. 1.
Figure 1:
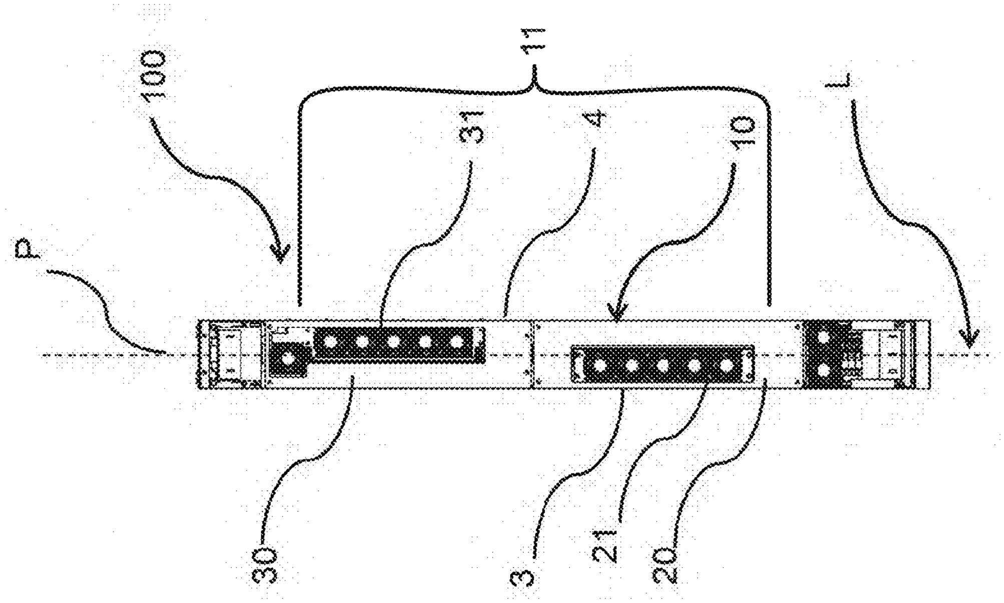
FIG. 1 shows a front view of an electronic power converter apparatus comprising two converter modules and a forced-ventilation cooling unit according to the invention.

With reference to FIGS. 1-2, reference numeral 100 is used to indicate an example of an electronic power converter apparatus as a whole, which can be housed in a switchgear panel or electric cabinet 1000, e.g., an electric cabinet for industrial applications.

Hereafter, for simplicity purposes, the electronic power converter apparatus 100 of the invention is also more simply referred to as an electronic converter apparatus or converter apparatus.

With reference to the example of FIGS. 1, 3A-3B, 4A-4B, the converter apparatus 100 comprises a box-like body 10 comprising a first base wall 1 and an opposite second base wall 2 joined to each other by a first 3 and a second 4 side wall, and by a bottom wall 5 orthogonal to the base walls 1, 2. The first 3 and second 4 side walls and the bottom wall 5 extend orthogonally from such base walls 1, 2 along a main longitudinal extension direction L of the box-like body 10 to delimit with such base walls 1, 2 a housing compartment 6 accessible from the outside through an insertion opening 7 opposite to the bottom wall 5.

Note that the aforesaid box-like body 10 has, for example, a rectangular parallelepiped shape having a width much less than the other two dimensions, height and depth. In a non-limiting embodiment, the dimensions of the box-like body are: height 1800 mm, depth 700 mm, and width 180 mm.

Moreover, the converter apparatus 100 comprises a first 20 and at least a second 30 converter module accommodated in said housing compartment 6 of the box-shaped body 10, so that the first converter module 20 is proximal to the first base wall 1 and the at least a second converter module 30 is superimposed on the first converter module along the aforesaid main longitudinal extension direction L of the box-like body 10. Such first 20 and at least a second 30 converter modules comprise a first and at least a second electronic circuitry, respectively, adapted to dissipate electrical energy by generating heat inside the box-like body 10 of the converter apparatus 100.

In a preferred, but not limiting embodiment, the first converter module 20 comprises an electronic power converter circuit, e.g., of the alternating current-direct current, AC/DC, type, referred to as Active Front End or AFE. The second converter module 30 comprises an electronic power converter circuit, e.g., of the direct current-direct-current, DC/DC, isolated type. However, the first 20 and second 30 converter modules can be of different types.

In addition, the converter apparatus 100 comprises:

- a forced-ventilation cooling unit 11 comprising a first 21 and at least a second 31 heat dissipation device associated with said first 20 and at least second 30 converter modules, respectively.

Such first 21 and at least second 31 heat dissipation devices are configured to convey a cooling air flow F1, F2 entering into the interior of the box-like body 10 of the electronic converter apparatus and to convey a corresponding heated air flow Fout exiting from the aforesaid box-like body 10 to cool said first 20 and at least second 30 converter modules by removing at least partially the heat generated by the aforesaid first and at least a second electronic circuitries.

In an embodiment, the first 21 and second 31 heat dissipation devices are embodied by heat sinks, for example made of aluminum.

Advantageously, the first heat dissipation device 21 is housed in said first converter module 20 to be interposed between the aforesaid first side wall 3 of the box-like body 10 and a median plane P of the box-like body 10 parallel to and equally spaced apart from said first 3 and second 4 side walls. Such a plane P is shown hatched in FIG. 4B.

Moreover, the at least a second heat dissipation device 31 is housed in the at least a second converter module 30 to be interposed between the aforesaid second side wall 4 of the box-like body 10 and such a median plane P.

Moreover, the converter apparatus 100 comprises mechanical means 22, 32 connected to the first 20 and the at least second 30 converter modules, and configured to delimit, with said first 3 and second 4 side walls of the box-like body 10, a first 25 and at least a second 35 duct or chimney, respectively, mutually separate and independent.

In particular, such mechanical means 22, 32 are configured to convey, into the box-like body 10 of the converter apparatus, a first F1R and at least a second F2R heated air flow, to be evacuated to the outside of the box-like body 10 as an exiting heated air flow Fout.

In a preferred embodiment, such mechanical means 22, 32 comprise a first 22 and at least a second 32 plate-like element or plate-shaped element having folded edge portions. Such first 22 and at least a second 32 plate-like elements can be made of a metal material, e.g., steel, or any non-metal material having heat-resistant properties.

In the embodiment in the figures, the aforesaid mechanical means 22, 32 comprise a first 22 and a second 32 plate-like element, i.e., only two plate-like elements.

In a further embodiment, the mechanical means comprise only the first plate-like element 22 having folded edge portions, connected to the first converter module 20, and configured to delimit, at least partially, with the first 3 and second 4 side walls of the box-like body 10, a first 25 and a second 35 chimney, respectively. Such chimneys 25, 35 are adapted to convey into the box-like body 10 of the converter apparatus the first F1R and second F2R heated air flows, to be evacuated to the outside of the box-like body 10 as the exiting heated air outlet flow Fout.

In yet another embodiment (not shown in the figures), such mechanical means comprise a single plate-like element having folded edge portions. Such a single plate-like element is manufactured by connecting the first 22 and second 32 plate-like elements in one piece.

With reference to the embodiment in FIGS. 9A-9D, the first plate-like element 22 comprises a first flat plate-like body 220 delimited by a first 221 and an opposite second 222 base edge, mutually parallel, connected to each other by a first side edge 223 which is straight and orthogonal to the first base edge 221, and an opposite second side edge 224; such a second side edge 224 comprises a straight edge portion 224*a* parallel to the first side edge 223 and a shaped edge portion 224*b* including a first straight segment 224' parallel to the first side edge 223 connected to an inclined connecting segment 224".

In particular, the length of such a first base edge 221 is greater than that of the second base edge 222 and a length of the first straight side edge 223 is greater than the sum of the lengths of the straight edge portion 224*a* of the second side edge 224 and the first straight segment 224' of the shaped edge portion 224*b*.

Figure 5A:
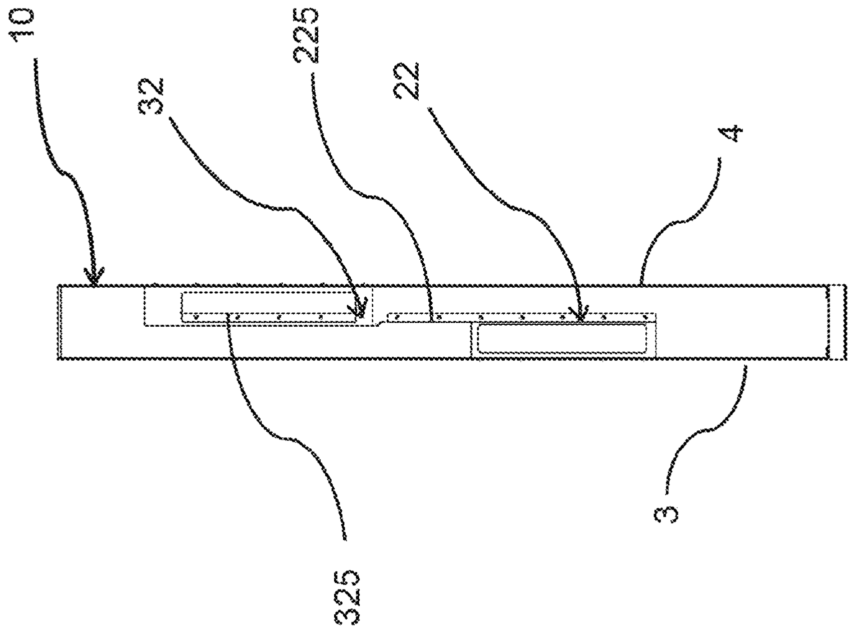
FIGS. 5A-5B show a front view and a perspective section view, respectively, of a box-like body of the converter apparatus in FIG. 1 and plate-shaped elements of the forced-ventilation cooling unit of the converter apparatus fixed to the box-like body.
Figure 5B:
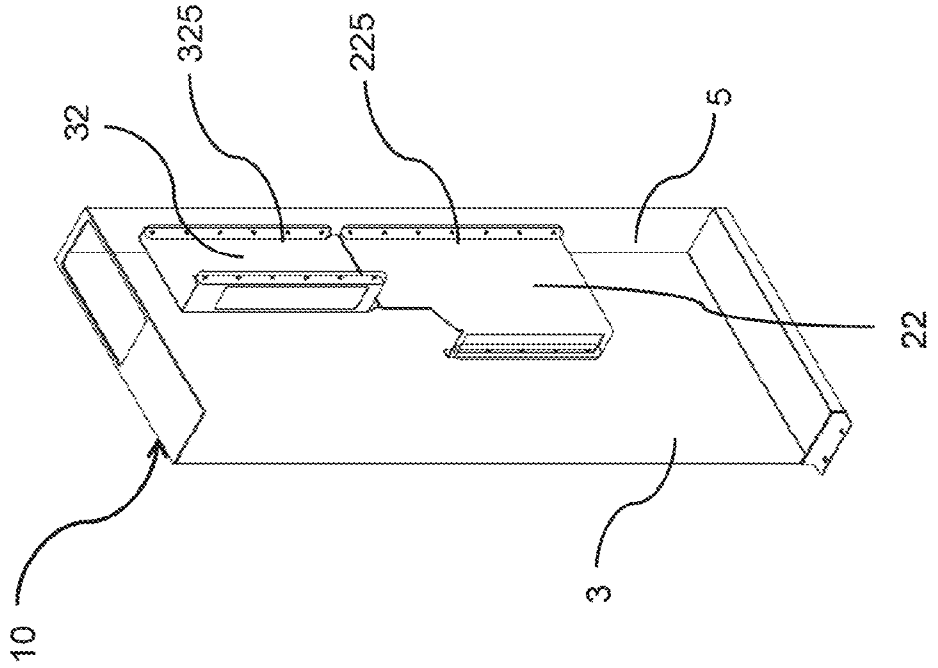
Figure 7:
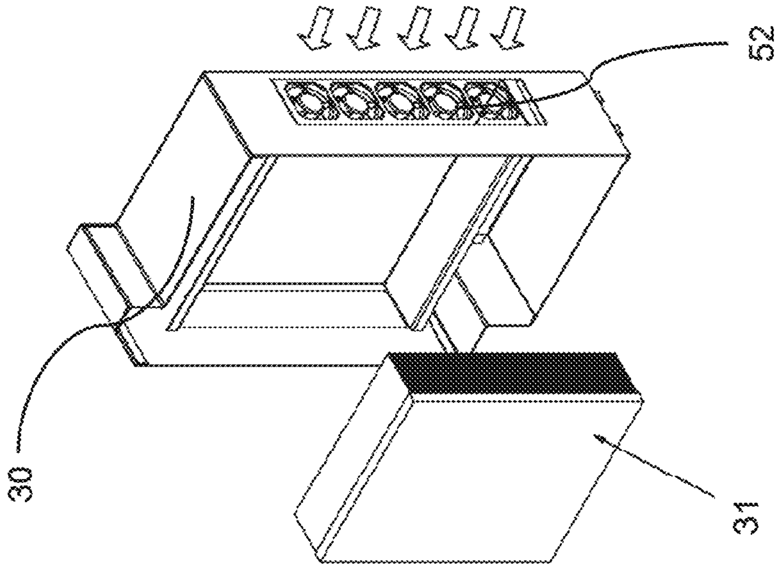
FIG. 7 shows an exploded right perspective view of a second converter module of the electronic power converter apparatus in FIG. 1 and a second heat sink device of the forced-ventilation cooling unit housable in the second converter module.
Figure 6:
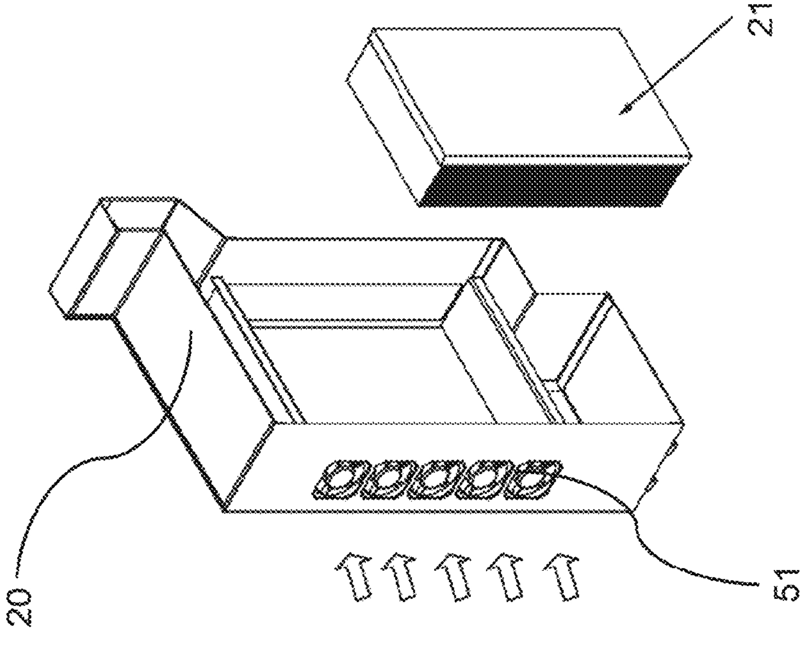
FIG. 6 shows an exploded left perspective view of a first converter module of the electronic power converter apparatus in FIG. 1 and a first heat sink device of the forced-ventilation cooling unit housable in the first converter module.
Figures 8A, 8B, 8C, 8D:
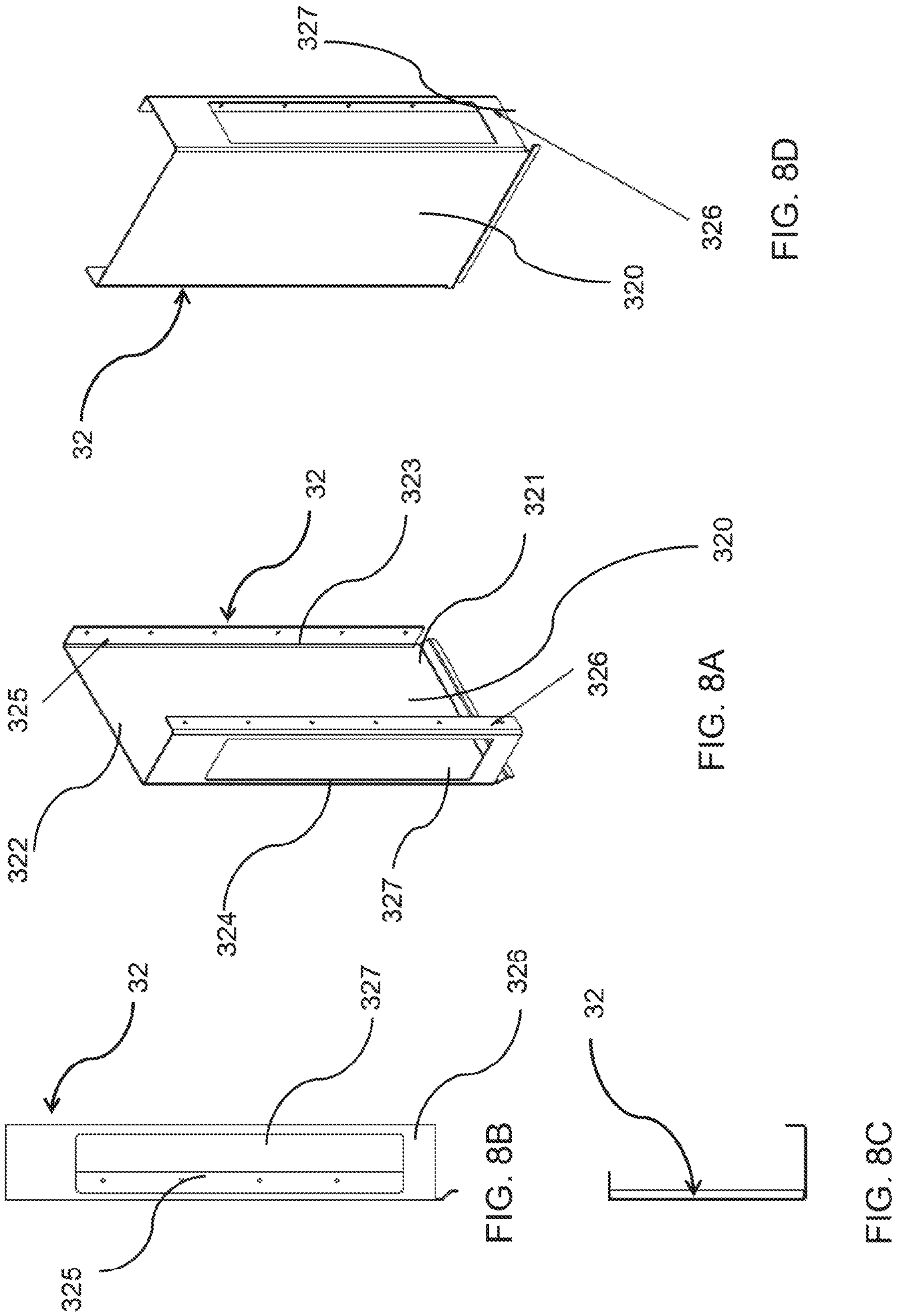
FIGS. 8A-8D show a left perspective view, a right perspective view, a front view, and a top view, respectively, of a first plate-shaped element of the forced-ventilation cooling unit of the electronic power converter apparatus in FIG. 4B.
Figure 9A:
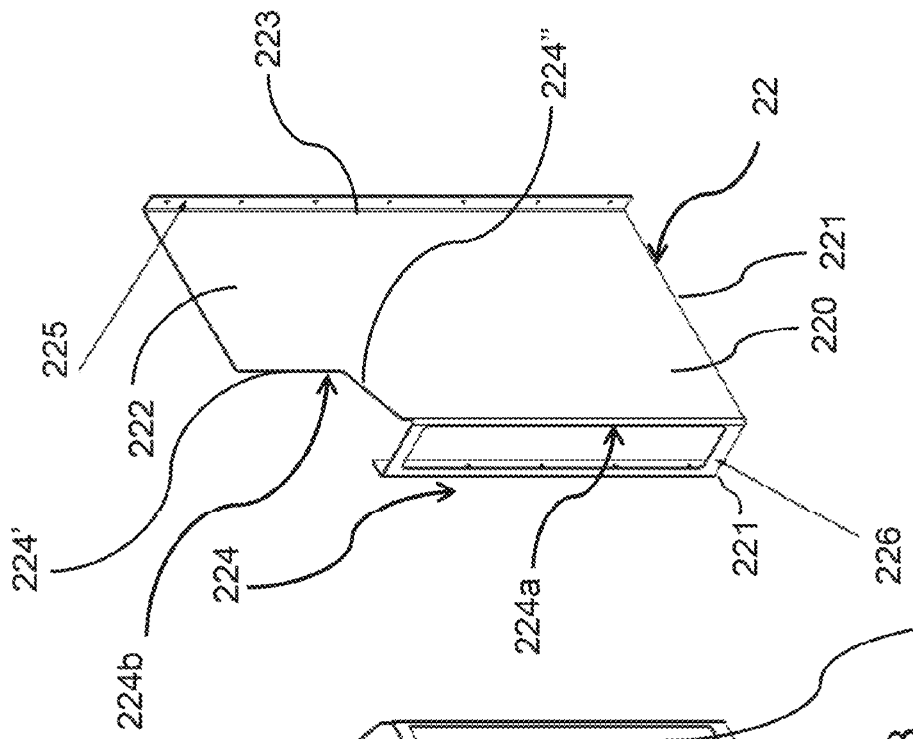
FIGS. 9A-9D show a left perspective view, a right perspective view, a front view, and a top view, respectively, of a second plate-shaped element of the forced-ventilation cooling unit of the electronic power converter apparatus in FIG. 4A.
Figure 9B:
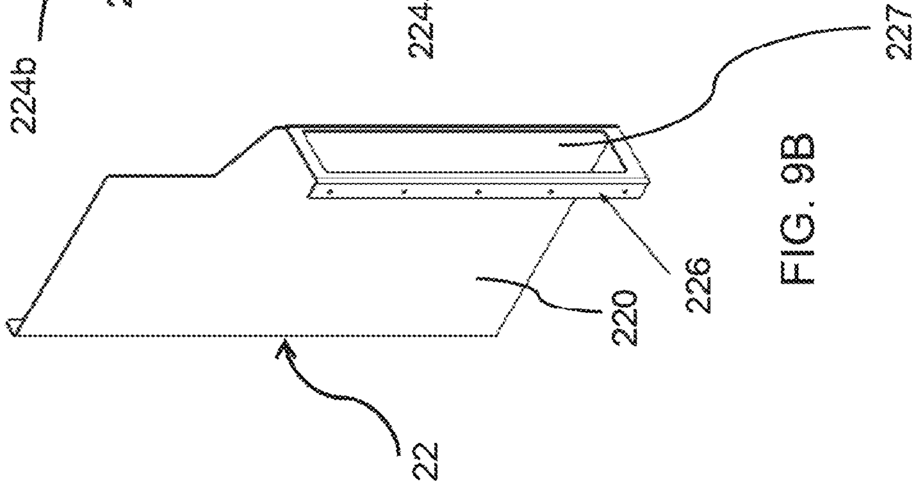
Figure 9C:
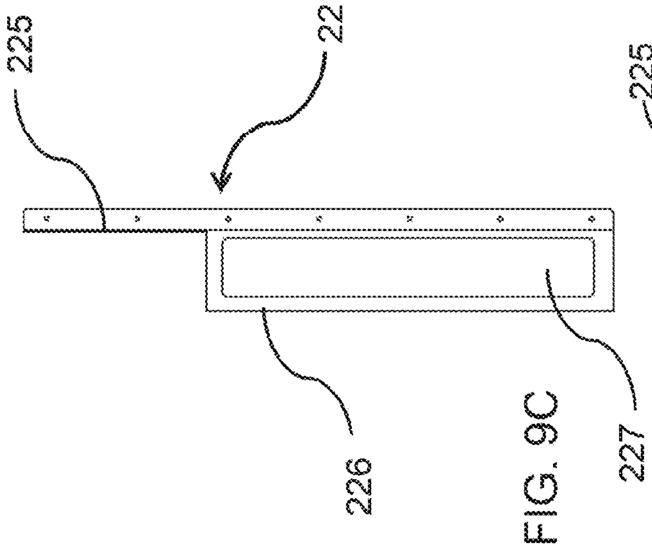
Figure 9D:
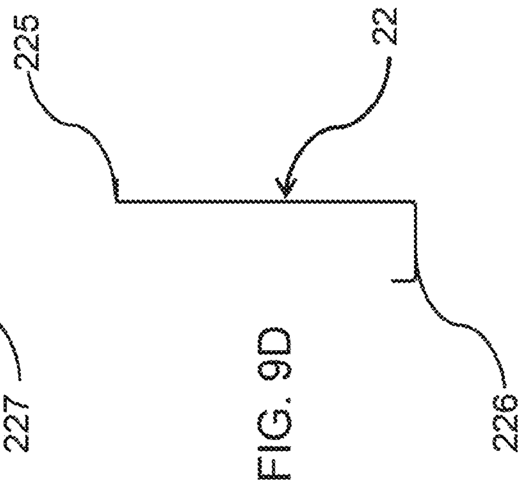

Moreover, the first plate-like element 22 comprises a first folded portion 225, which extends orthogonally to the first flat plate-like body 220 from said first side edge 223; such a first folded portion 225 is configured to fix the first plate-like element to the bottom wall 5 of the box-like body 10, e.g., by means of screws or rivets (see FIG. 5B).

In addition, the first plate-like element 22 comprises a second folded portion 226, which extends orthogonally to the first flat plate-like body 220 from the straight edge portion 224*a* of the second side edge 224. Such a second folded portion 226 is L-configured to fix the first plate-like element to the first side wall 3 of the box-like body 10, e.g., by means of screws or rivets. Moreover, the second folded portion 226 comprises a through opening 227 adapted to be interfaced, under operating conditions, to the first heat dissipation device 21 housed in the first converter module 20.

Referring to the embodiment in FIGS. 8A-8D, the second plate-like element 32 comprises a respective second flat plate-like body 320 delimited by a first 321 and an opposite second 322 base edge, mutually parallel, connected together by a first 323 and an opposite second 324 straight side edge. Such first 323 and second 324 side edges are mutually parallel.

In particular, the first base edge 321 and the second base edge 322 have the same length and the first straight side edge 323 has the same length as the second straight side edge 324.

Moreover, the second plate-like element 32 comprises a respective first folded portion 325, which extends orthogonally to the second flat plate-like body 320 from said first straight side edge 323; the first folded portion 325 is configured to fix the second plate-like element 32 to the bottom wall 5 of the box-like body 10, e.g., by means of screws or rivets (see FIG. 5B).

In addition, the second plate-like element 32 comprises a respective second folded portion 326, which extends orthogonally to the second flat plate-like body 320 from the second side straight edge 324. Such a second folded portion 326 is L-configured to fix the second plate-like element 32 to the second side wall 4 of the box-like body 10, e.g., by means of screws of rivets, and comprises a respective through opening 327 adapted to be interfaced, under operating conditions, to the second heat dissipation device 31 housed in the second converter module 30.

Referring to the embodiment in FIGS. 4A-4B, 6, and 7, the forced-ventilation cooling unit 11 of the converter apparatus 100 comprises a first 51 and at least a second 52 ventilation assembly accommodated in said first 20 and second 30 converter modules to be operatively associated with the first 21 and the at least a second 31 heat dissipation devices, respectively.

For example, such ventilation assemblies 51, 52 consist of one or more fans, five in the example shown in the figures, configured to forcedly convey air from the outside environment to the interior of the box-like body 10 of the converter apparatus 100. In particular, such fans operate to force a cooling air flow into the apparatus which heats up by mixing with the air inside the apparatus.

Figure 3B:
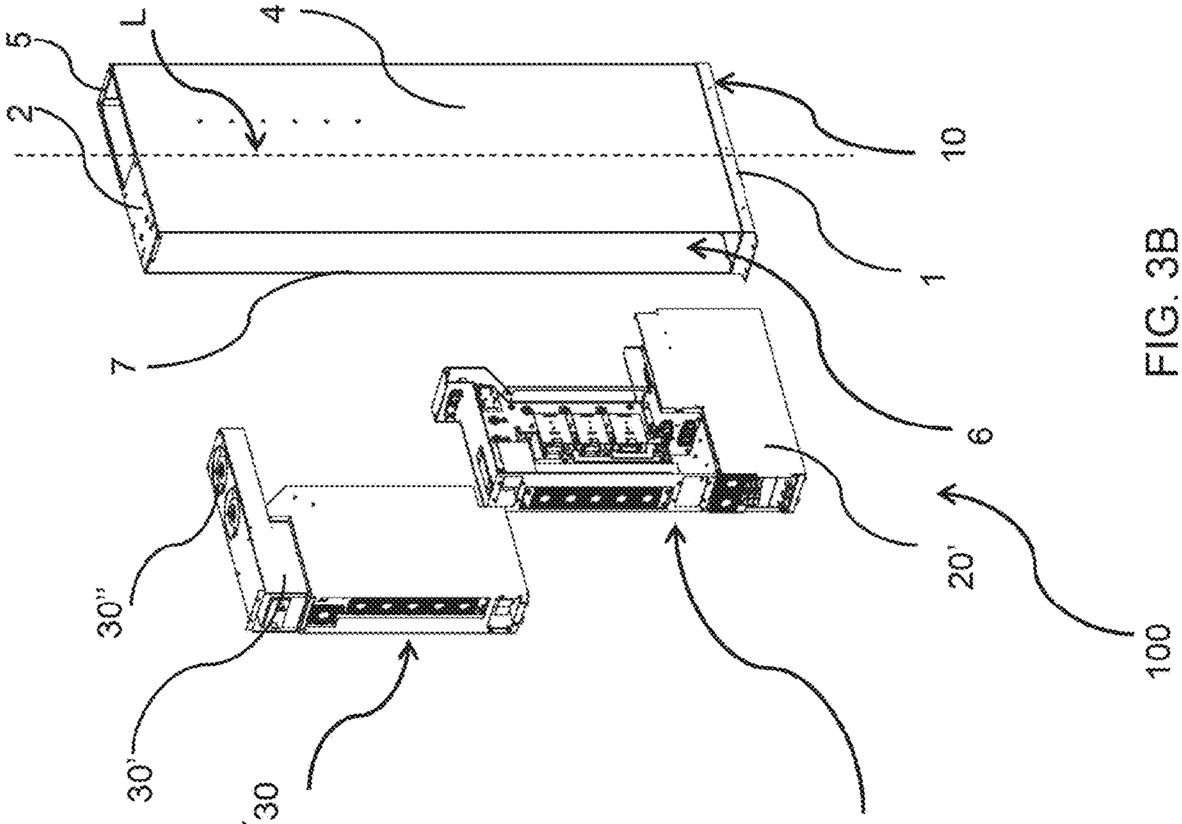
FIGS. 3A-3B show a right perspective view and a left perspective view, both exploded, respectively, of the electronic power converter apparatus in FIG. 1.
Figure 3A:
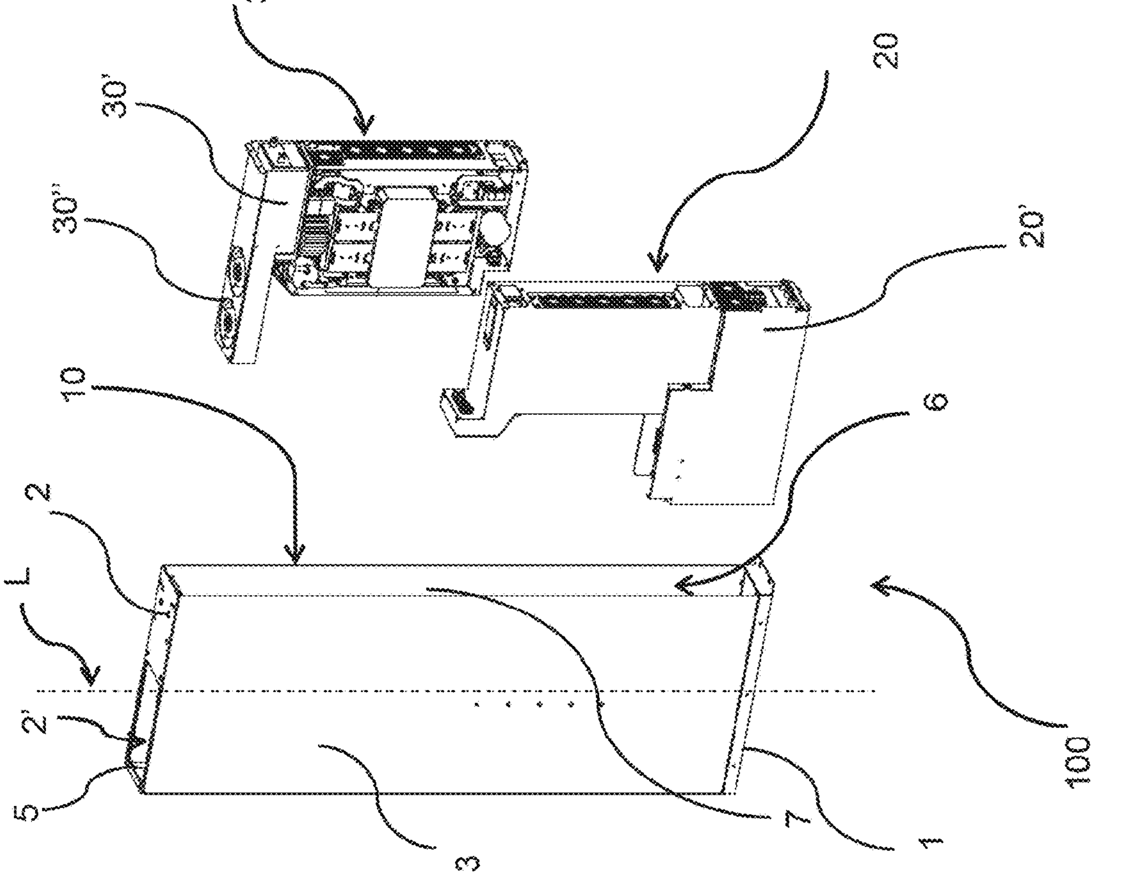

In the embodiment in FIGS. 3A-3B, the electronic converter apparatus 100 of the invention further comprises an inlet module 20', e.g., in alternating current, of the first converter module 20, interposed between the first base wall 1 and the aforesaid first converter module 20. Such an inlet module 20' is configured to electrically connect the first converter module 20 to a supply voltage source, e.g., in alternating current, outside the converter apparatus 100.

Figure 4B:
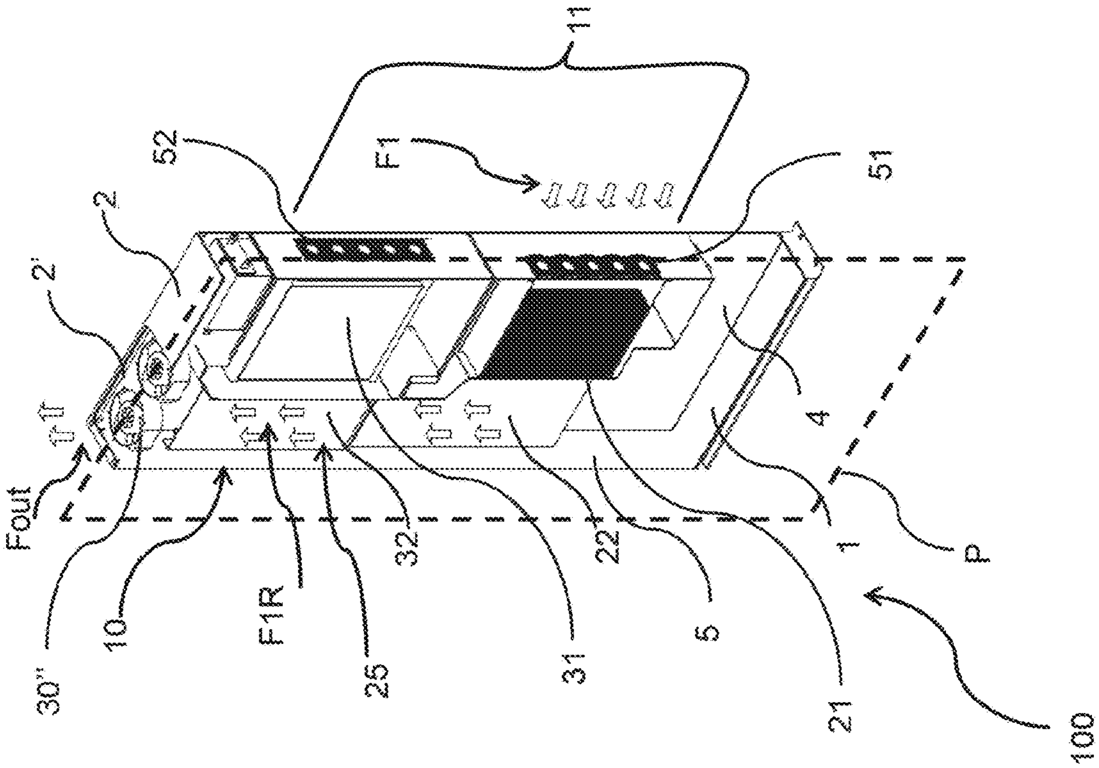
FIGS. 4A-4B show a left perspective view and a right perspective view, partially in section, respectively, of a first example of the electronic power converter apparatus in FIG. 1.
Figure 4A:
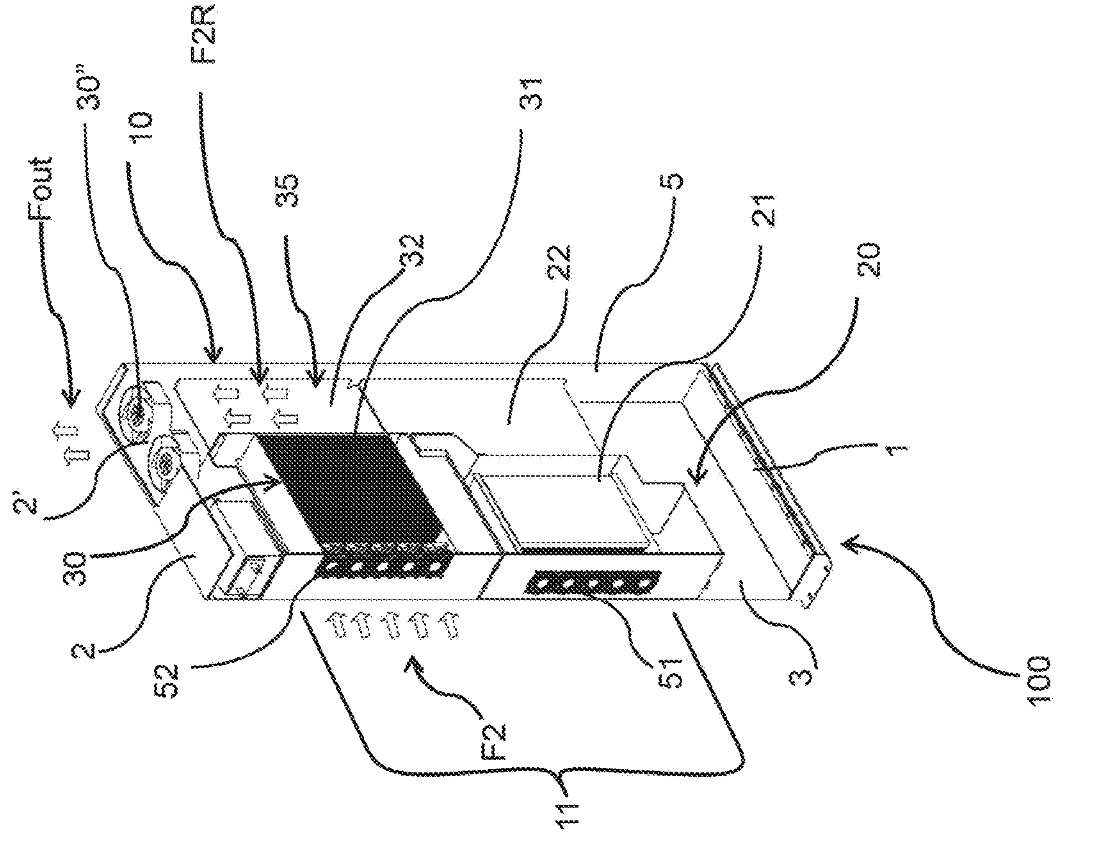

In the embodiment in FIGS. 3A-3B, the electronic converter apparatus 100 of the invention further comprises an outlet module 30', e.g., in direct current, of the second converter module 30. Such an outlet module 30' is interposed between the aforesaid second base wall 2 and the second converter module 30. As shown in FIGS. 4A-4B, the second base wall 2 comprises a first through opening 2'. Such an outlet module 30' comprises a further ventilation assembly 30", which includes, for example, two fans and is configured to convey the heated air flow Fout exiting from the box-like body 10 to the outside of the converter apparatus 100 through such a first through opening 2' of the second base wall 2.

Figure 10B:
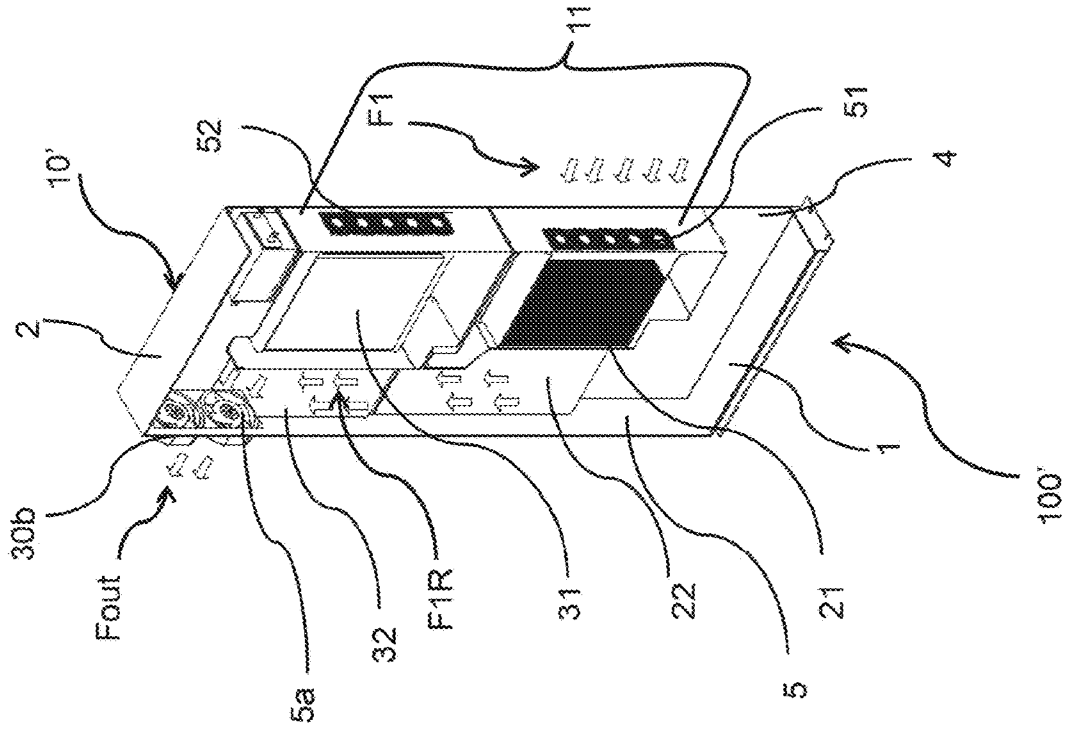
FIGS. 10A-10B show a left perspective view and a right perspective view partially in section, respectively, of a second embodiment of the electronic power converter apparatus in FIG. 1.
Figure 10A:
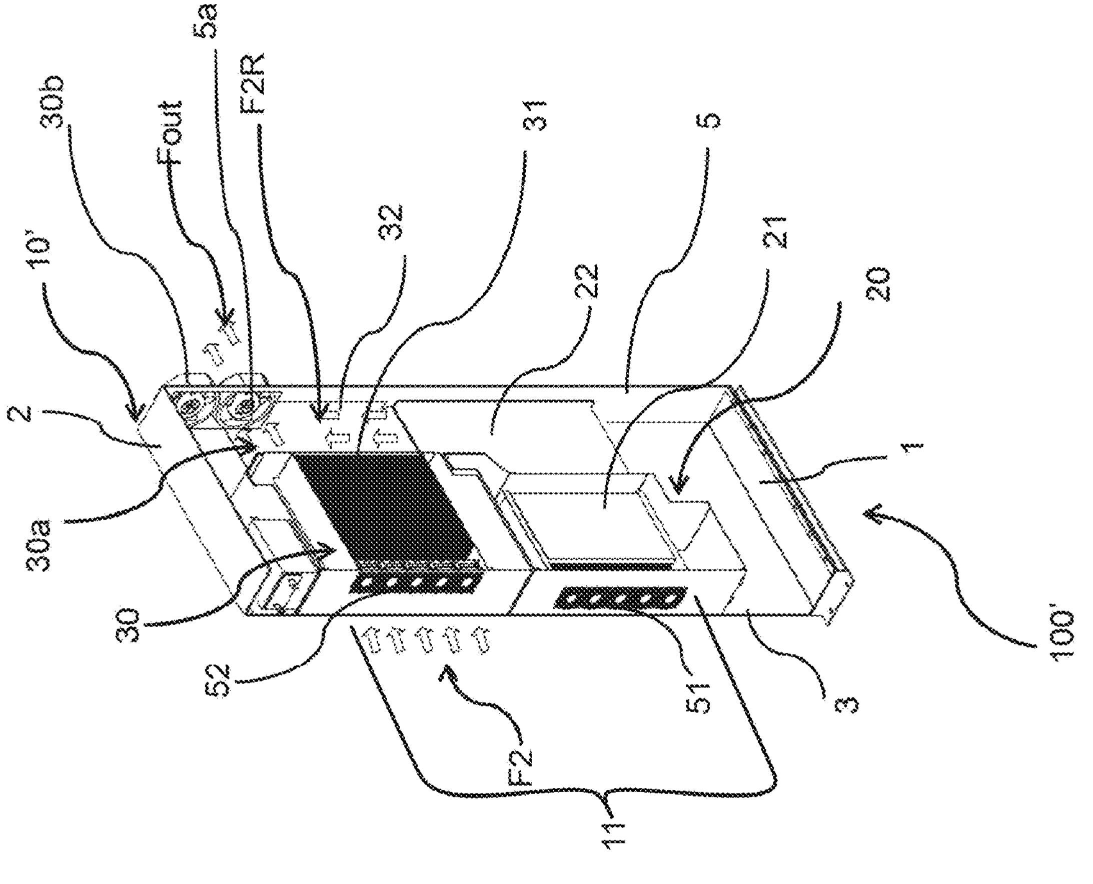

With reference to FIGS. 10A-10B, reference numeral 100' is used to indicate as a whole a second example of an electronic power converter apparatus according to the invention.

In particular, such an electronic converter apparatus 100' is substantially similar to the converter apparatus 100 and comprises a first 20 and at least a second 30 converter module accommodated in the housing compartment 6 of the box-like body 10 similar to those described with reference to FIGS. 4A-4B.

In addition, the converter apparatus 100' comprises a forced-ventilation cooling unit 11 comprising a first 21 and at least a second 31 heat dissipation device associated with said first 20 and at least second 30 converter modules, respectively.

Such first 21 and at least second 31 heat dissipation devices are configured to convey a cooling air flow F1, F2 entering into the interior of the box-like body 10' of the electronic converter apparatus 100' and to convey a corresponding heated air flow Fout exiting from the aforesaid box-like body 10' to cool the first 20 and the at least second 30 converter modules.

Such first 21 and second 31 heat dissipation devices are similar to those described with reference to the converter apparatus 100.

Moreover, the converter apparatus 100 comprises mechanical means 22, 32 connected to the first 20 and the at least second 30 converter modules, and configured to delimit, with the first 3 and second 4 side walls of the box-like body 10, a first 25 and at least a second 35 duct or chimney, respectively, mutually separate and independent.

In particular, such mechanical means 22, 32 are configured to convey into the box-like body 10' of the converter apparatus a first F1R and at least a second F2R heated air flow, to be evacuated to the outside of the box-like body 10' as an exiting heated air flow Fout.

In the embodiment in FIGS. 10A-10B, the electronic converter apparatus 100' of the invention further comprises a respective outlet module 30*a*, e.g., in direct current, of the second converter module 30. Such an outlet module 30*a* comprises a further ventilation assembly 30*b*, which includes two fans, for example. Moreover, the box-like body 10' of the converter apparatus 100' comprises a respective first through opening 5*a* obtained on the bottom wall 5 close to the second base wall 2.

The further ventilation assembly 30*b* is configured to convey the heated air flow Fout exiting from the box-like body 10' to the outside of the converter apparatus 100' through the respective first through opening 5*a* of the bottom wall 5.

The present invention also relates to an electric cabinet 1000 for industrial applications comprising one or more electronic power converter apparatuses 100, 100' of the invention. With reference to FIG. 2, the electric cabinet 1000 comprises four converter apparatuses 100, 100'.

The present invention also relates to a direct current, DC, charging system for an electric vehicle including at least one electronic power converter apparatus 100, 100' of the invention.

The electronic power converter apparatus, housable in a switchgear panel or electric cabinet and including two or more mutually superimposed converter modules of the present invention, has several advantages and achieves the pre-set objects.

Indeed, by placing the heat sinks 21, 31 in a staggered position with respect to each other, the construction of two separate and independent ducts 25, 35 or "chimneys" for the heated air inside the box-like body 10 of the converter apparatus 100 allows such heated air to be evacuated from an opening 2' located either above the converter apparatus 100 itself or laterally with reference to the apparatus 100', thus avoiding the heat produced by the Joule effect by the first heat sink 21 of the first converter module 20 from heating the second converter module 30 and the circuitry thereof.

Obviously, such a contrivance can also be applied to the case of a converter apparatus comprising more than two converter modules, or rather, in the case of a forced-ventilation cooling unit employing more than two heat sinks. In this case, all the heat sinks will be mutually staggered for the construction of the mutually separate heat disposal chimneys. In other words, any configuration which allows for heat flow separation can be used to achieve such an effect.

Moreover, the structure of the converter apparatus 100 of the invention lends itself well to manufacturing electronic systems obtained by connecting several converter apparatuses in parallel with one other, which can also share electrical parts. It is thus possible not only to increase the overall power provided by the system but also to control and power different parts of the same application solution, e.g., various drives of the same machine tool.

Moreover, with the converter apparatus 100, since the air used to cool the circuits is drawn from the front portion of the apparatus itself, while the exiting heated air exits through the opening 2', along a direction orthogonal to that of withdrawal, no interference in the hot air flow is actually created in the case of systems including several converter apparatuses 100 placed mutually in parallel side by side.

Moreover, with reference to the configuration of a system including several converter apparatuses 100 or 100' in parallel, in case of failure of an apparatus, it is possible, based on a command, even remotely, to electrically disconnect the outlet and inlet of each individual apparatus via internal contactors (relays) driven by the electronic boards. Each apparatus is thus electrically separated from the others and the overall system is made flexible and modular.

Those skilled in the art may make changes and adaptations to the embodiments of the electronic converter apparatus of the invention or can replace elements with others which are functionally equivalent in order to meet contingent needs without departing from the scope of the appended claims. Each of the features described above as belonging to one possible embodiment can be implemented irrespective of the other embodiments described.

The invention claimed is:

1. An electronic power converter apparatus comprising:

a box-like body comprising a first base wall and an opposite second base wall joined to each other by a first side wall and a second side wall and by a bottom wall orthogonal to said base walls, said first and second side walls and said bottom wall extending orthogonally from said base walls along a main longitudinal extension direction of the box-like body to delimit, with said base walls, a housing compartment accessible from outside through an insertion opening opposite to the bottom wall;

a first converter module and at least a second converter module accommodated in said housing compartment of the box-like body so that said first converter module is proximal to said first base wall and said at least a second converter module is superimposed on said first converter module along said main longitudinal extension direction of the box-like body, said first converter module and at least a second converter module comprising a first and at least a second electronic circuitry, respectively, adapted to dissipate electrical energy by generating heat inside the box-like body;

a forced-ventilation cooling unit comprising a first heat dissipation device and at least a second heat dissipation device associated with said first and at least second converter modules, respectively, said first and at least second heat dissipation devices being configured to convey cooling air flows entering into the interior of the box-like body of the electronic converter apparatus and to convey corresponding heated air flows exiting from said box-like body, to cool said first and at least second converter modules by removing at least partially heat generated by said first and at least a second electronic circuitries;

wherein said first heat dissipation device is housed in said first converter module to be interposed between said first side wall of the box-like body and a median plane of the box-like body parallel to and equally spaced apart from said first and second side walls;

wherein the at least a second heat dissipation device is housed in said at least a second converter module to be interposed between said second side wall of the box-like body and said median plane.

2. The electronic power converter apparatus according to claim 1, further comprising mechanical means connected to the first and the at least a second converter modules, and configured to delimit, with said first and second side walls of the box-like body, a first and at least a second chimney, respectively, separated and independent from each other.

3. The electronic power converter apparatus according to claim 1, further comprising a first and at least a second plate-like element with folded edge portions, the first and second plate-like elements connected to the first and the at least a second converter modules, and configured to delimit, with said first and second side walls of the box-like body, a first and at least a second chimney, respectively, separated and independent from each other.

4. The electronic power converter apparatus according to claim 1, further comprising a first plate-like element and a second plate-like element, the first and second plate-like elements connected in one piece to each other to form a single plate-like element having folded edge portions connected to the first and the at least a second converter modules, and configured to delimit, with said first and second side walls of the box-like body, a first and at least a second chimney, respectively, separated and independent from each other.

5. The electronic power converter apparatus according to claim 1, further comprising a single plate-like element with folded edge portions connected to the first converter module, and configured to delimit at least partially, with said first and second side walls of the box-like body, a first chimney and a second chimney.

6. The electronic power converter apparatus according to claim 3, wherein said first plate-like element comprises a first flat plate-like body delimited by a first base edge and an opposite second base edge connected to each other by a first straight side edge and an opposite second side edge, said second side edge comprising a straight edge portion parallel to the first side edge and a shaped edge portion including a first straight segment parallel to the first side edge connected to an inclined connecting segment.

7. The electronic power converter apparatus according to claim 6, wherein said first base edge has a greater length than a length of the second base edge and the first straight side edge has a greater length than a sum of lengths of the straight edge portion of the second side edge and the first straight segment of the shaped edge portion.

8. The electronic power converter apparatus according to claim 6, wherein said first plate-like element comprises a first folded portion extending orthogonally to the first flat plate-like body from said first side edge, said first folded portion being configured to fix the first plate-like element to the bottom wall of the box-like body.

9. The electronic power converter apparatus according to claim 6, wherein said first plate-like element comprises a second folded portion extending orthogonally to the first flat plate-like body from the straight edge portion of the second side edge, said second folded portion being L-configured to fix the first plate-like element to the first side wall of the box-like body and comprising a through opening adapted to be interfaced, under operating conditions, to the first heat dissipation device housed in the first converter module.

10. The electronic power converter apparatus according to claim 3, wherein said second plate-like element comprises a respective second flat plate-like body delimited by a first base edge and an opposite second base edge connected to each other by a first straight edge and an opposite second straight side edge.

11. The electronic power converter apparatus according to claim 10, wherein the first base edge and the second base edge have a same length and the first straight side edge has a same length as the second straight side edge.

12. The electronic power converter apparatus according to claim 10, wherein said second plate-like element comprises a respective first folded portion extending orthogonally to the second flat plate-like body from said first straight side edge, said first folded portion being configured to fix the second plate-like element to the bottom wall of the box-like body.

13. The electronic power converter apparatus according to claim 10, wherein said second plate-like element further comprises a second folded portion extending orthogonally to the second flat plate-like body from the second straight side edge, said second folded portion being L-configured to fix the second plate-like element to the second side wall of the box-like body and comprising a respective through opening adapted to be interfaced, under operating conditions, to the second heat dissipation device housed in the second converter module.

14. The electronic power converter apparatus according to claim 1, wherein said forced-ventilation cooling unit comprises a first ventilation assembly and at least a second ventilation assembly accommodated in said first and second converter modules to be operationally associated with the first and at least a second heat dissipation devices, respectively.

15. The electronic power converter apparatus according to claim 1, wherein said first converter module comprises a power electronic converter circuit of an alternating current-direct current (AC/DC) type and said second converter module comprises a power electronic converter circuit in direct current-direct current (DC/DC) and isolated.

16. The electronic power converter apparatus according to claim 1, further comprising an inlet module of the first converter module, interposed between said first base wall and said first converter module, said inlet module being configured to electrically connect the first converter module to a supply voltage source outside the converter apparatus.

17. The electronic power converter apparatus according to claim 1, further comprising an outlet module of the second converter module, interposed between said second base wall and said second converter module, said second base wall comprising a first through opening, said outlet module comprising a further ventilation assembly configured to convey heated air flow exiting from said box-like body to outside of the converter apparatus through said first through opening of said second base wall.

18. The electronic power converter apparatus according to claim 1, further comprising an outlet module of the second converter module, interposed between said bottom wall and said second converter module, said bottom wall) comprising a respective first through opening, said outlet module comprising a further ventilation assembly configured to convey the heated air flow exiting from said box-like body toward the outside of the converter apparatus through said first through opening of said bottom wall.

19. An electric cabinet for industrial applications comprising at least one electronic power converter apparatus according to claim 1.

20. A direct current, DC, charging system of an electric vehicle comprising at least one electronic power converter apparatus according to claim 1.

* * * * *